US006271657B1

(12) United States Patent
Nemoto (10) Patent No.: US 6,271,657 B1
(45) Date of Patent: Aug. 7, 2001

(54) TEST HEAD POSITIONER FOR SEMICONDUCTOR DEVICE TESTING APPARATUS (75) Inventor: Shin Nemoto, Yono (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/119,817

(22) Filed: Jul. 23, 1998

(30) Foreign Application Priority Data

Jul. 25, 1997 (JP) ...................................... 9-200255

(51) Int. Cl.[7] .............................. B25J 1/00; B25J 19/00; G01R 31/26; G12B 5/00
(52) U.S. Cl. ........................ 324/158.1; 324/765; 269/1; 269/55
(58) Field of Search ................................ 324/765, 158.1; 269/1, 55, 58, 60, 903; 414/589; 73/168

(56) References Cited

U.S. PATENT DOCUMENTS

| 4,705,447 | * | 11/1987 | Smith | 414/590 |
| 4,857,838 | | 8/1989 | Willberg | 324/158 |
| 5,149,029 | | 9/1992 | Smith | 248/124 |
| 5,506,512 | | 4/1996 | Tozawa et al. | 324/754 |
| 5,568,056 | * | 10/1996 | Ishimoto | 324/754 |
| 5,606,262 | | 2/1997 | Montalbano et al. | 324/758 |
| 5,818,219 | * | 10/1998 | Hama et al. | 324/158.1 |

FOREIGN PATENT DOCUMENTS

| 3526137 | 1/1987 | (DE) . |
| 3615941 | 11/1987 | (DE) . |
| 3617741 | 12/1987 | (DE) . |
| 4007011 | 9/1991 | (DE) . |
| 102217 | 3/1984 | (EP) . |
| 237697 | 9/1987 | (EP) . |
| 7240448 | 9/1995 | (JP) . |

* cited by examiner

Primary Examiner—Glenn W. Brown
(74) Attorney, Agent, or Firm—Gallagher & Lathrop; David N. Lathrop (57) ABSTRACT A hand-operated test head positioner for positioning the test head of a semiconductor device testing apparatus is provided which is easy to operate, highly safe in operation, and yet inexpensive. Two air cylinders are installed one at each of two opposed positions of the test head. The sum of driving forces of these air cylinders is set at a level approximately equivalent to the weight of the test head to act as a counterbalancer. Hand-operated jack mechanisms are disposed on the opposite side walls of the test head, respectively. The jack mechanisms comprise long lead screws rotatably supported, two movable screw members in threaded engagement with the respective lead screws, drive arms pivotally connected at one ends to the respective movable screw members, and driven arms having approximately the same shape and size as the drive arms and being pivotally connected to the respective drive arms, respectively. By manually rotating one of the lead screws, the movable screw members are simultaneously moved thereby moving the test head vertically upwardly and downwardly.

12 Claims, 7 Drawing Sheets

TEST HEAD POSITIONER FOR SEMICONDUCTOR DEVICE TESTING APPARATUS

BACKGROUND OF THE INVENTION

1. Field of the Invention

The present invention relates generally to a semiconductor device testing apparatus for testing semiconductor devices, and more particularly to a test head positioner for moving what is called the test head of a semiconductor device testing apparatus to a predetermined elevation and holding it in position when it is mounted in the test section of the testing apparatus.

2. Description of the Related Art

Many semiconductor device testing apparatuses (commonly called IC tester), which measures for measuring the electrical characteristics of semiconductor devices to be tested (commonly called DUT (device under test)) by applying a test signal having a predetermined pattern to the devices, have a semiconductor transporting and handling (processing) apparatus (commonly called handler) integrally connected thereto for transporting semiconductor devices to a test or testing section. In the test section, the DUTs are brought into electrical contact with device sockets on that portion which is called test head (a component of the testing apparatus for supplying and receiving various types of electrical signals for test) (which will be referred to as test head hereinafter). Thereafter the tested semiconductor devices are carried out of the test section and sorted into conforming and non-conforming articles on the basis of the test results. The semiconductor device testing apparatus which has connected thereto the semiconductor transporting and handling apparatus of the type described above (which will be referred to as handler), is herein termed simply "IC tester." In the following disclosure the present invention will be described in terms of semiconductor integrated circuits (which will be referred to as IC hereinafter), which are typical examples of semiconductor devices, for the convenience of explanation.

Figure 3:
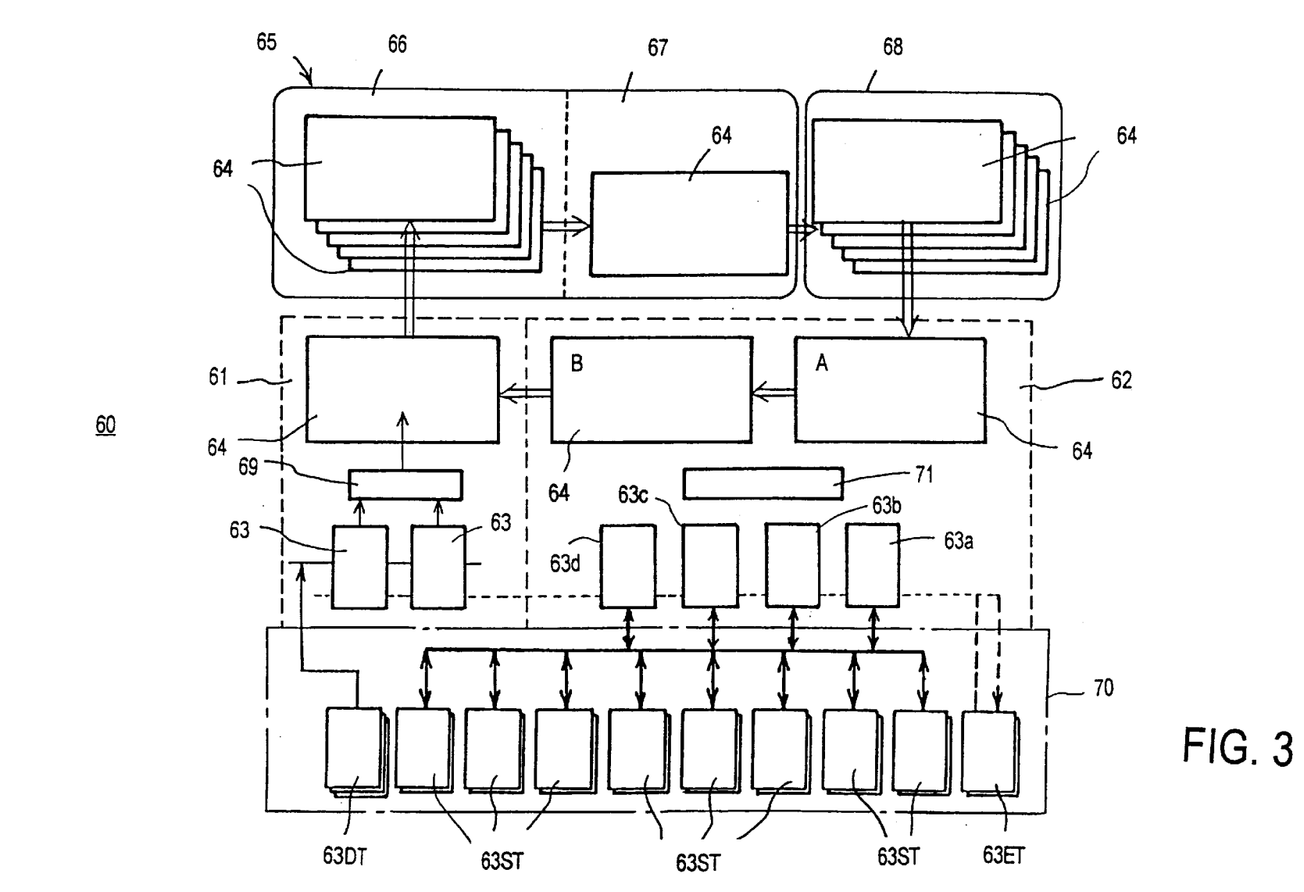
FIG. 3 is a representation illustrating one example of the semiconductor device testing apparatus to which the present invention is applicable.

First, the general construction of one example of the conventional handler called horizontal transporting type will be briefly described with reference to FIG. 3.

The illustrated handler 60 comprises a loader section 61 for transferring and reloading ICs to be tested (ICs under test) onto a test tray 64, a constant temperature chamber 65 containing a soak chamber 66 and a test section 67, an exit chamber 68 (also known as heat-removal/cold-removal chamber) for removing heat or cold from tested ICs as carried in on the test tray 64 from the test section 67 subsequently to undergoing a test in the test section 67, and an unloader section 62 for receiving ICs as carried in on the test tray 64 from the exit chamber 68, transferring and reloading them from the test tray 64 onto a universal (general-purpose) tray (also known as customer tray) 63.

The soak chamber 66 and test section 67 of the constant temperature chamber 65 and the exit chamber 68 are arranged in the order named from left to right as viewed in the figure (referred to as X-axis direction herein) while the loader section 61 and unloader section 62 are located in front of the constant temperature chamber 65 and the exit chamber 68. Further, disposed in the forwardmost portion of handler 60 is a tray storage section 70 for storing universal trays 63DT loaded with ICs to be tested, universal trays 63ST loaded with ICs already tested and sorted, and empty universal trays 63ET.

The soak chamber 66 of the constant temperature chamber 65 is designed for imposing temperature stresses of either a predetermined high or low temperature on ICs under test loaded on a test tray 64 in the loader section 61 while the test section 67 is designed for executing electrical tests on the ICs under the predetermined temperature stress imposed in the soak chamber 66. In order to maintain the ICs loaded with temperature stresses of either a predetermined high or low temperature in that temperature during the test, the soak chamber 66 and test section 67 are both contained in the constant temperature chamber 65 and are capable of maintaining the interior atmosphere at a predetermined temperature.

The test tray 64 is moved in a circulating manner from and back to the loader section 61 sequentially through the soak chamber 66 and the test section 67, the exit chamber 68, and the unloader section 62. In this path of circulating travel, there are disposed a predetermined number of test trays 64 which are successively moved in the direction as indicated by arrows in the figure.

A test tray 64, loaded with ICs under test from a universal tray 63 in the loader section 61, is conveyed from the loader section 61 to the constant temperature chamber 65, and then introduced into the soak chamber 66 through an inlet port formed in the front wall of the constant temperature chamber 65. The soak chamber 66 is equipped with a vertical transport mechanism which is configured to support a plurality of (say, 5) test trays 64 in the form of a stack with predetermined spacings between adjacent trays. In the illustrated example, a test tray newly received from the loader section 61 is supported on the uppermost tray support stage while the test tray supported on the lowermost tray support stage is transported out to the test section 67 which on the left-hand side (upstream side) in the X-axis direction, adjoins and communicates with the lower portion of the soak chamber 66. It is thus to be appreciated that test trays 64 are delivered out in the direction perpendicular to that in which they have been introduced.

The vertical transport mechanism moves test trays supported on the successive tray support stages sequentially to the respective next vertically (which is referred to as Z-axis direction) downward tray support stages. ICs being tested are loaded with either a predetermined high or low temperature stress as the test tray supported on the uppermost tray support stage is moved sequentially to the lowermost tray support stage and during a waiting period until the test section 67 is emptied.

In the test section 67 there is located a test head, not shown. The test tray 64 which has been carried one by one out of the constant temperature chamber 65 is placed onto the test head where a predetermined number of ICs out of the ICs under test loaded on the test tray are brought into electrical contact with device sockets (not shown) mounted on the test head. Upon completion of the test on all of the ICs placed on one test tray through the test head, the test tray 64 is conveyed to the right (downstream) in the X-axis direction to the exit chamber 68 where the tested ICs are relieved of heat or cold.

Like the soak chamber 66 as described above, the exit chamber 68 is also equipped with a vertical transport mechanism adapted to support a plurality of (say, five) test trays 64 stacked one on another with predetermined spacings therebetween. In the illustrated example, a test tray newly received from the test section 67 is supported on the lowermost tray support stage while the test tray supported on the uppermost tray support stage is discharged to the unloader section 62. The vertical transport mechanism moves test trays supported on the successive tray support stages sequentially to the respective next vertically upward tray support stages. The tested ICs are relieved of heat or cold to be restored to the outside temperature (room temperature) as the test tray supported on the lowermost tray support stage is moved sequentially to the uppermost tray support stage.

Since the IC test is typically conducted on ICs having a desired temperature stress in a wide range of temperatures from −55° C. to +125° C. imposed thereon in the soak chamber 66, the exit chamber 68 cools the ICs with forced air down to the room temperature if the ICs have had a high temperature of, say, about +120° C. applied thereto in the soak chamber 66. If ICs have had a low temperature of, say, about −30° C. applied thereto in the soak chamber 66, the exit chamber 68 heats them with heated air or a heater up to a temperature at which no condensation occurs. Although test trays 64 constructed of a material capable of withstanding such a wide range of temperatures, that is, high/low temperatures are usually employed, it is, of course, not required that the test tray 64 be constructed of a material capable of withstanding high/low temperatures if ICs are tested at the room temperature.

After the heat removal or cold removal process, the test tray 64 is conveyed in the direction (which is referred to as Y-axis direction) perpendicular to that in which it has been introduced from the test section 67 and toward the front of the exit chamber 68 and is discharged from the exit chamber 68 to the unloader section 62.

The unloader section 62 is configured to sort the tested ICs carried on the test tray 64 by categories based on the data of the test results and transfer them onto the corresponding universal trays 63. In this example, the unloader section 62 provides for stopping the test tray 64 at two positions A and B. The ICs on the test trays 64 stopped at the first position A and the second position B are sorted out based on the data of the test results and transferred onto and stored in the universal trays of the corresponding categories at rest at the universal tray set positions (stop positions), four universal trays 63a, 63b, 63c and 63d in the example illustrated.

The test tray 64 emptied in the unloader section 62 is delivered back to the loader section 61 where it is again loaded with ICs being tested from the universal tray 63 to repeat the same steps of operation.

It should be noted here that the number of universal trays 63 that can be installed at the universal tray set positions in the unloader section 62 is limited to four by the space available in this example. Hence, the number of categories into which ICs can be sorted in real time operation is limited to four categories. While four categories would generally be sufficient to cover three categories for subclassifying "conforming articles" into high, medium and low response speed elements in addition to one category allotted to "nonconforming article," in some instances there may be some among the tested ICs which do not belong to any of these categories. Should there be found any tested ICs which should be classified into a category other than the four categories, a universal tray 63 assigned to the additional category should be taken from the tray storage section 70 and be transported to the universal tray set position in the unloader section 62 to store the ICs in that universal tray. In doing that, it would also be needed to transport any one of the universal trays positioned in the unloader section 62 to the tray storage section 70 for storage therein.

If the replacement of the universal trays is effected in the course of the sorting operation, the latter operation would have to be interrupted during the replacement. For this reason, in this example a buffer section 71 is disposed between the stop positions A and B for the test tray 64 and the locations of the universal trays 63a–63d. The buffer section 71 is configured to temporarily keep tested ICs belonging to a category of rare occurrence. The buffer section 71 may have a capacity of accommodating, say, about twenty to thirty ICs and be equipped with a memory portion for storing the category of ICs placed in IC storage locations in the buffer section 71. The locations and category of the individual ICs temporarily kept in the buffer section 71 are thus stored in the memory portion. Between the sorting operations or upon the buffer section 71 being filled with ICs, a universal tray for the category to which the ICs kept in the buffer section belong is carried from the tray storage section 70 to the unloader section 62 to receive the ICs. It should be noted that ICs temporarily kept in the buffer section 71 may be scattered over a plurality of categories. In that case, it would be required to transport as many universal trays as the number of categories at a time from the tray storage section 70 to the unloader section 62.

An X-Y transport (not shown) equipped with a movable head (which is known in the art concerned as pick-place head) is used to transfer ICs under test from the universal tray 63 at a standstill at the universal tray set positions (stop positions) to the corresponding test trays. The IC pick-up pad (IC grasping member) mounted on the bottom surface of this movable head is brought into abutment with an IC placed on the universal tray 63 to attract and grasp it by vacuum suction for transfer from the universal tray 63 to the test tray 64. An X-Y transport of similar construction is used also to transfer tested ICs from the test trays 64 to the universal trays 63 in the unloader section 62. The movable head is usually provided with a plurality of, say, eight pick-up pads so that eight ICs at a time may be transferred between universal and test trays.

Although not shown, a tray transport is disposed above the tray storage section 70. In the loader section 61, the tray transport conveys a universal tray 63DT loaded with ICs to be tested from the tray storage section 70 to the universal tray set position (where ICs to be tested are to be transferred to a test tray). An emptied universal tray 63 is stored in a predetermined position (usually the location where empty universal trays 63ET are stored). Likewise in the unloader section 62, the aforesaid tray transport conveys universal trays of the various categories from the tray storage section 70 to the corresponding universal tray set positions (where the universal trays are to receive tested ICs from the test trays 64). Once one universal tray 63 has been fully filled, it is stored at a predetermined location in the tray storage section 70 while an empty universal tray 63ET is transported from the tray storage section 70 to the universal tray set position by the tray transport.

Further, in the loader section 61, a position corrector 69 for correcting the orientation or position of an IC called "preciser" is located between the universal tray set position and the stop position for the test tray 64. The IC position corrector or preciser 69 includes relatively deep recesses into which ICs are allowed to fall down prior to being transferred from the universal tray to the test tray 64. The recesses are each bounded by slanted side walls which prescribe for the depth to which the ICs drop into the recesses. Once eight ICs have been positioned relative to each other by the preciser 69, those accurately positioned ICs are again grasped by the movable head and transferred to the test tray 64. The universal tray 63 is provided with recesses for holding ICs which are oversized as compared to the size of ICs, resulting in wide variations in positions of ICs stored in the universal tray 63. Consequently, if the ICs as such were grasped by the movable head and transferred directly to the test tray 64, there might be some of them which could not be successfully deposited into the IC storage recesses in the test tray 64. This is the reason for requiring the preciser 69 which acts to array ICs as accurately as the array of the IC storage recesses in the test tray 64.

In the IC tester having connected therewith the handler of the construction as described above, it is seen from FIG. 4 that a test head 81 which is mounted in the test section 67 of the handler 60 is constructed separately from the IC tester proper 80 (called main frame in the art concerned) in which there are accommodated primary electric and electronic circuits, power sources, etc. The connection between the IC tester proper 80 and the test head 81 is established by means of a signal transmission line 82 such as a cable, for example. The test head 81 contains therein a measuring circuit (including drivers, comparators and others) and has a performance board, not shown, mounted on the top thereof. On this performance board there are mounted a predetermined number of device sockets (which are IC sockets as semiconductor devices to be tested are ICs).

Figure 4:
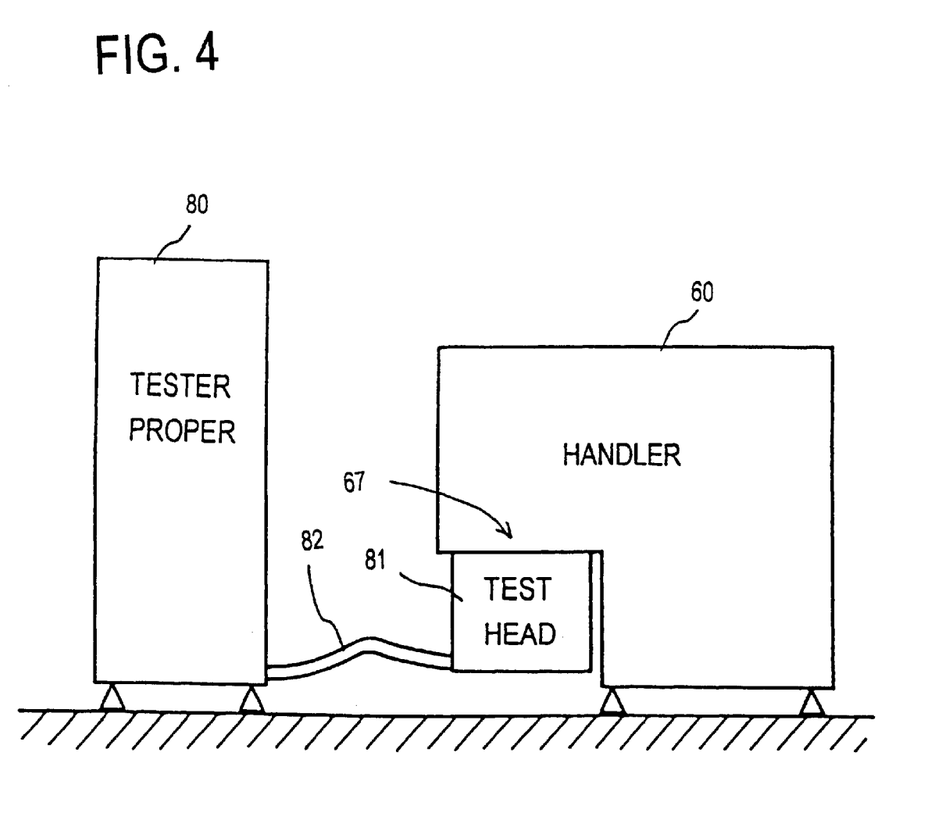
FIG. 4 is a side view illustrating one example of the arrangement of the principal components of the semiconductor device testing apparatus shown in FIG. 3.

As is apparent from FIG. 4, the test head 81 is mounted on the bottom of the test section 67 of the handler 60 (the bottom of the constant temperature chamber of the handler in this example) such that the IC sockets of the test head 81 are exposed to the interior of the test section 67 of the handler 60 through an opening formed in the bottom of the test section 67. This arrangement requires a positioner for moving the test head 81 up and down in the Z-axis direction (vertically) and holding it in position.

As is well known in the art, the number of ICs which can be simultaneously tested in the test section 67 depends on the number of IC sockets which can be mounted on the test head 81. In recent years, there has been a need for in an increase in number of ICs which can be simultaneously tested in the test section (simultaneous measurement throughput in number of ICs) in an attempt to enhance the utilization ratio of the IC tester, leading to an increase in number of IC sockets mounted on the test head, resulting necessarily in an enlarged test head. Consequently, there is a tendency for the test head to increase in weight. By way of example, there are heavy test heads that weigh up to 300 kg. Unfortunately, these test heads must be exchanged for others in accordance with the type of ICs to be tested, the contents of the test, the size of test trays used, and other considerations. In consideration of the need for maintenance services, as well, it is preferable that the test head be easy to remove.

In this regard, the test head is mounted by means of a fixture (which is called Hi-fix base or test fixture in the art concerned) in the test section 67 of the handler. Accordingly, when the test head is mounted in the test section, the procedures are taken which involve transporting such a heavy test head from behind the handler to a predetermined position below the test section, moving the test head vertically upwardly from that position to a predetermined elevation, holding it in position, and then mounting the fixture in the test section.

A jack mechanism has been conventionally used as a positioner for moving a heavyweight test head from a position below the test section vertically upwardly to a predetermined elevation and holding it in position. This type of jack mechanism heretofore in use will be described below with reference to FIGS. 5 and 6.

Figure 5:
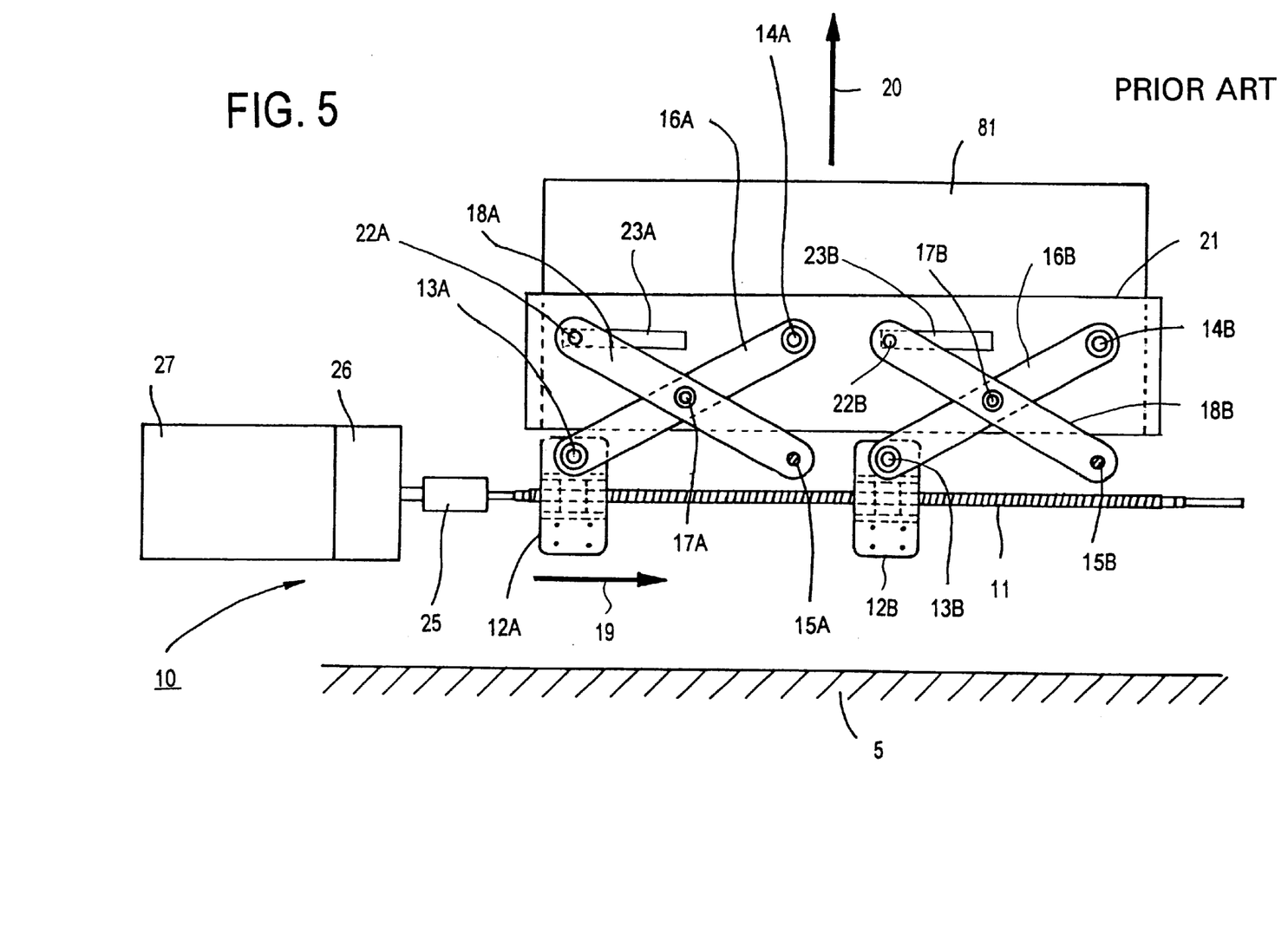
FIG. 5 is a side view illustrating one example of the prior art test head positioner for the semiconductor device testing apparatus.

FIG. 5 is a side view illustrating the general construction of one example of the prior art jack mechanism for moving a relatively heavy test head vertically upwardly and downwardly. As noted above, on the top of the test head there is usually mounted a performance board, on the top of which there are mounted a predetermined number of IC sockets, which are in turn attached to the test section. However, the test head is shown merely as a block 81 in FIG. 5 since it is intended to illustrate the jack mechanism 10 for the test head. It is to be noted that although only one side of the test head 81 is shown in FIG. 5, another jack mechanism of an identical construction is provided on the opposite side of the test head.

The illustrated jack mechanism 10 includes two screw pairs comprising a long lead screw (externally threaded screw in this example) 11 horizontally (left-to-right direction in the figure) extending along the lower end edge on one lateral side of the test head 81 at a predetermined elevation below the bottom surface of the test head 81 and two movable screw members 12A and 12B spaced apart from each other by a predetermined distance and having threads (internal threads in this example) therein in threaded engagement with the lead screw 11.

The movable screw members 12A and 12B of these two screw pairs may each comprise a ball screw (having a steel ball received in a spiral groove defined between opposed external and internal threads), for example. The movable screw members 12A and 12B are reciprocally moved along the lead screw 11 in the direction indicated by an arrow 19 in the figure and the opposite direction depending on the direction of rotation of the lead screw 11 about its own axis. Implanted perpendicularly (in a direction passing through the plane of the drawing of FIG. 5) in the peripheral wall of the movable screw members 12A and 12B adjacent their tops are studs 13A and 13B, respectively, each having one end protruding outwardly.

The jack mechanism 10 further includes two connecting studs 14A and 14B spaced apart from each other by a predetermined distance in the direction of extension of the lead screw 11 and implanted into a generally rectangular movable support block 21 at substantially the same elevation so as to protrude perpendicularly outwardly, the movable support block 21 being attached to the side wall of the test head 81; two fixed studs 15A and 15B spaced apart from each other by a predetermined distance in the direction of extension of the lead screw 11 and implanted into a support member, not shown, at substantially the same elevation (a position somewhat below the movable support block 21 in this example) so as to protrude perpendicularly outwardly toward the test head, the support member being disposed at a predetermined spacing outwardly from and in opposition to the lead screw 11; two drive arms 16A and 16B pivotally connected at one ends to the studs 13A and 13B, respectively, (which will be referred to as first fixed studs hereinafter) fixed to the movable screw members 12A and 12B, respectively, and pivotally connected at the other ends to the connecting studs 14A and 14B, respectively, of the movable support block 21; two driven arms 18A and 18B pivotally connected at one ends to the studs 15A and 15B (which will be referred to as second fixed studs hereinafter), respectively, fixed to the support member; and pivot studs 17A and 17B pivotally connecting the corresponding drive arms and driven arms generally at the middle points intermediate their opposite ends.

Secured to and protruding from the other ends of the driven arms 18A and 18B toward the test head 81 are slide studs 22A and 22B, respectively, which are received in horizontally elongated slots 23A and 23B, respectively, formed in the movable support block 21 at corresponding positions such that the slide studs 22A and 22B will slidingly move in the elongated slots 23A and 23B as the driven arms 18A and 18B are pivotted.

The support member disposed in opposition to the lead screw 11 may be directly secured to a supporting base 5 (which is, in this example, an installation surface on which the handler is installed) or alternatively the frame of the handler may be utilized as the support member.

It is to be noted that the second fixed studs 15A and 15B may be fixed to separate support members (two members in this example), respectively secured to the supporting base 5. The pivot studs 17A and 17B may be fixed to either of the corresponding drive arms and the driven arms.

The lead screw 11 is rotatably journaled by a plurality of supports, not shown, secured to the supporting base 5, and is connected at one end through a coupling 25 and a reduction gear 26 with the rotary output shaft of a motor 27 which is also secured to the supporting base 5. On the other hand, the movable screw members 12A, 12B are slidably supported on a guide rail, not shown, secured to the supporting base 5 or the supports for the lead screw 11 and extending in a direction along the lead screw 11.

The driven arms 18A, 18B have substantially the same shape and size as the drive arms 16A, 16B and are coupled by the corresponding pivot studs 17A, 17B to the drive arms 16A, 16B in the form of an X figure. Accordingly, rotating the lead screw 11 in a clockwise (forward) direction, for example moves the two movable screw members 12A, 12B toward the fixed studs 15A, 15B in a direction indicated by the arrow 19 in the figure to thereby move the drive arms 16A, 16B from the position shown toward a vertical position, so that the driven arms 18A, 18B are moved from the position shown toward a vertical position as they are moved upward. Consequently, the movable support block 21 is moved upwardly in a vertical direction indicated by an arrow 20 in the drawing, and hence the test head 81 attached to the movable support block 21 is also moved vertically upwardly.

In the initial position illustrated in FIG. 5, the arrangement is such that the central axes of the first fixed studs 13A, 13B of the movable screw members 12A, 12B and of the second fixed studs 15A, 15B of the support member disposed in opposition to the lead screw 11 lie at substantially the same elevation (in the same horizontal plane), that the central axes of the connecting stud 14A of the movable support block 21 and of the second fixed stud 15A of the support member disposed in opposition to the lead screw 11 lie in substantially the same vertical plane, and that the central axes of the connecting stud 14B of the movable support block 21 and of the second fixed stud 15B of the support member disposed in opposition to the lead screw 11 lie in substantially the same vertical plane. However, the arrangement is not limited to that illustrated.

Since a generally rectangular movable support block and a jack mechanism of an identical construction are provided also on the opposite side of the test head 81, the test head 81 is supported at a predetermined elevation above the supporting base 5 by a pair of movable support blocks and jack mechanisms (lead screws, movable screw members, drive arms and driven arms) disposed on the opposite sides of the test head 81, as shown. In some instances the supporting base 5 may comprise a frame of the handler.

The operation of the jack mechanism 10 constructed as discussed above will now be described below.

First, the test head 81 is transported to a predetermined position below the test section of the handler, and the movable support blocks 21 are attached to the test head 81 on its opposite side walls. At this point, the jack mechanism 10 is in the initial position illustrated in FIG. 5. The motor is then driven to rotate the lead screw 11 in a clockwise direction in this example, whereby the movable screw members 12A, 12B in the position shown in FIG. 5 are moved in a direction indicated by the arrow 19 in the drawing, so that the one ends of the drive arms 16A, 16B pivotally supported by the first fixed studs 13A, 13B of the movable screw members 12A, 12B are moved gradually toward the second fixed studs 15A, 15B, respectively. As a result, since the driven arms 18A, 18B are pivotally supported at one ends by the second fixed studs 15A, 15B, respectively, the drive arms 16A, 16B are pivoted (counterclockwise) about the pivot studs 17A, 17B toward a vertical position to thereby lift the connecting studs 14A and 14B secured to the movable support block 21 upwardly. Concurrently, the pivotal movement of the drive arms 16A, 16B toward the vertical position moves the pivot studs 17A, 17B obliquely to the right and upwardly, and thereby causes the driven arms 18A, 18B to be pivoted (clockwise) about the second fixed studs 15A, 15B toward a vertical position. As a result, a drive force is produced to move the connecting studs 14A and 14B of the movable support block 21 upwardly in a vertical direction indicated by the arrow 20 in the drawing. Consequently, the movable support block 21 is moved upwardly in a vertical direction indicated by the arrow 20, and hence the test head 81 attached to the movable support block 21 is concurrently moved vertically upwardly.

It is thus to be appreciated that by rotating the lead screw 11 by means of the motor 27, the test head 81 is gradually raised vertically to a predetermined elevation as it is precisely positioned with respect to the test section of the handler. Upon the test head reaching that elevation, the motor 27 is deactuated to hold the test head 81 at that elevation. In this state, the test head 81 is mounted in place to the test section of the handler by means of a fixture such as a Hi-fix base such that the IC sockets mounted on the test head 81 are exposed in the interior of the test section.

When the test head 81 is to be lowered, the fixture is disconnected from the test section of the handler prior to rotating the lead screw 11 by means of the motor 27 in a counterclockwise direction in this example. It will be obvious that this will move the two movable screw members 12A, 12B in a direction opposite from that indicated by the arrow 19 to thereby lower the test head 81 to the initial position shown in FIG. 5, and no further explanation will be necessary.

Figure 6:
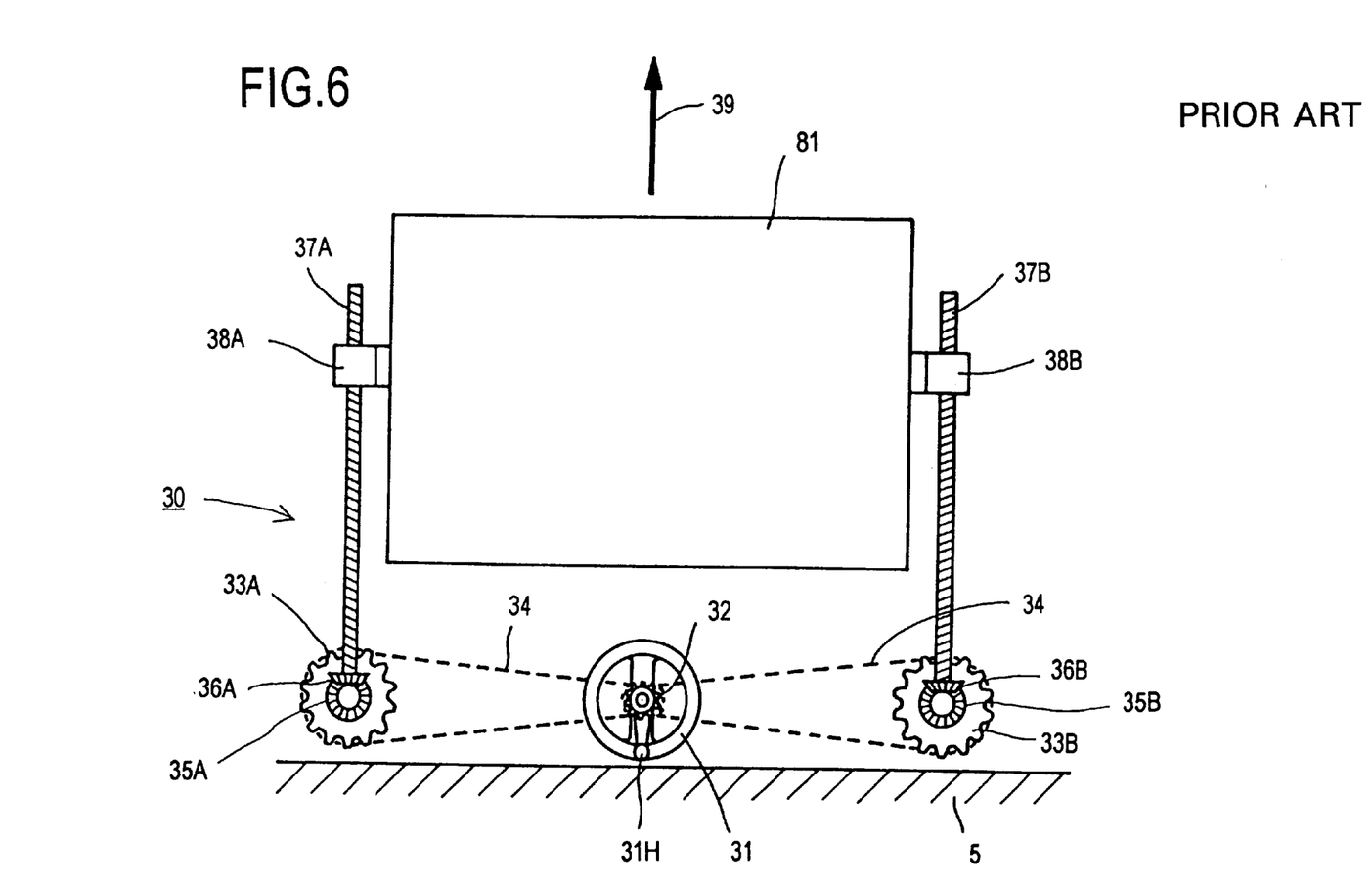
FIG. 6 is a front view illustrating another example of the prior art test head positioner for the semiconductor device testing apparatus.

FIG. 6 is a front view illustrating the general construction of an example of the prior art jack mechanism for moving a relatively less heavy test head vertically upwardly and downwardly. This jack mechanism is configured to be moved up and down by hand. As the representation of FIG. 6 is intended primarily to illustrate the jack mechanism 10 for the test head, the test head is shown merely as a block 81. It is also to be noted that as in FIG. 6 the test head 81 is seen from the front, the left and right sides as viewed in the figure of the test head are opposed lateral side walls (although FIG. 6 would be a rear view if the test head is looked at from the front of the IC tester, it is said here to be a front view because the test head is the subject of the present invention).

The illustrated jack mechanism 30 includes a small diameter sprocket 32 rotatably supported on a supporting base 5 at a predetermined elevation below the bottom surface of the test head 81 generally in the center thereof, and two large diameter sprockets 33A and 33B spaced apart from each other by a predetermined distance and disposed in opposed relation on opposite sides of the small diameter sprocket 32. These two large diameter sprockets 33A and 33B are rotatably supported on the supporting base 5 somewhat outwardly of the side walls of the test head 81.

The small diameter sprocket 32 has a handle 31 coaxially secured thereto, and the small diameter sprocket 32 and the two large diameter sprockets 33A, 33B are drivingly connected by a chain 34 trained therearound. In this case, the size and number of gear teeth of these sprockets 32, 33A and 33B are preselected such that as the small diameter sprocket 32 is rotated manually by a grip 31H affixed to the handle 31, the two large diameter sprockets 33A, 33B are rotated through the chain 34 at the same speed, but at a speed considerably slower than the rotational speed of the small diameter sprocket 32.

The large diameter sprockets 33A, 33B have first bevel gears 35A and 35B, respectively coaxially secured thereto for rotation in unison with the sprockets 33A, 33B. Disposed at approximately right angles to and meshed with the first bevel gears 35A and 35B are second bevel gears 36A and 36B, respectively, which are secured to the lower ends of vertically extending lead screws (externally threaded in this example) 37A and 37B, respectively. These lead screws 37A and 37B are rotatably supported on either the supporting base 5 or a frame of the handler and are in threaded engagement with threaded members 38A and 38B, respectively attached to the side walls of the test head 81 generally in the middle of the horizontal dimension. These threaded members 38A and 38B may each comprise a ball screw, for example having internal threads therein in mesh with the lead screws 37A and 37B. Accordingly, rotation of the first bevel gears 35A and 35B will rotate the threadedly associated second bevel gears 36A and 36B in unison with which the lead screws 37A and 37B are rotated to move the threaded members 38A and 38B vertically.

Next, the operation of the jack mechanism 30 constructed as discussed above will be described.

First, the test head 81 is transported to a predetermined position below the test section of the handler, and the threaded members 38A and 38B are attached to the test head 81 on its opposite side walls. At this point, the jack mechanism 30 is in the initial position illustrated in FIG. 6. Then, the operator rotates the handle 31 by means of the grip 31H in a clockwise direction in this example to thereby rotate the small diameter sprocket 32 in a clockwise direction. The two large diameter sprockets 33A, 33B are thus rotated clockwise through the chain 34 at the same speed but at a speed considerably slower than the rotational speed of the small diameter sprocket 32, so that the first bevel gears 35A and 35B fixed to the sprockets 33A, 33B are rotated clockwise to cause the second bevel gears 36A and 36B in mesh with the first bevel gears 35A and 35B to be rotated counterclockwise.

In this example, the arrangement is such that counterclockwise rotation of the lead screws 37A and 37B will cause vertically upward movement of the threaded members 38A and 38B while clockwise rotation of the lead screws 37A and 37B will cause vertically downward movement of the threaded members 38A and 38B. The test head 81 is thus moved upwardly as shown by an arrow 39 in the figure by the upward movement of the threaded members 38A and 38B. It will thus be appreciated the test head 81 may be raised vertically to a predetermined elevation as it is precisely positioned with respect to the test section of the handler. Upon the test head reaching that elevation, the rotation of the handle 31 is ceased to hold the test head 81 at that elevation. In this state, the test head 81 is mounted in place to the test section of the handler by means of a fixture such as a Hi-fix base such that the IC sockets mounted on the test head 81 are exposed in the interior of the test section.

When the test head 81 is to be lowered, the fixture is disconnected from the test section of the handler prior to rotating the handle 31 counterclockwise this time to rotate the lead screws 37A and 37B in a clockwise direction. It is evident that this will move the two threaded members 38A and 38B vertically downwardly to thereby lower the test head 81 to the initial position shown in FIG. 6, and further descriptions are omitted.

The jack mechanism 10 as described above with reference to FIG. 5 would be attended with no problem in terms of the driving force and speed of vertical motion of the test head since it is configured to move the test head vertically by the use of the motor 27. However, a circuit for controlling the motor is required. In addition, it is required from a viewpoint of securing safety to accurately grasp the mutual positional relation between the jack mechanism 10 and the test section of the handler to which the test head 81 is to be coupled, hence requiring communication means for that purpose. Further, it is necessary to make arrangements for preventing the test head 81 from falling in the event of accidental failure of power source.

In contrast, the jack mechanism 30 described with reference to FIG. 6 would require no control circuit, since it is configured to permit the test head 81 to be moved vertically by hand by connecting the small diameter sprocket 32 and the large diameter sprockets 33A, 33B through the chain 34 to augment the rotary driving force by the handle through a speed reduction. However, an increase in weight of the test head 81 leads to a corresponding increase in the force required to maneuver the handle. Additionally, there are various difficulties with the maneuverability including the limitation on the speed of rotation of the handle 31 due to the manual operation and the slow speed of the vertical movements of the test head 81 due to the speed reduction required to provide an increase in the rotary driving force.

SUMMARY OF THE INVENTION

An object of the present invention is to provide a hand-operated test head positioning apparatus for positioning the test head of a semiconductor device testing apparatus which is easy to operate, highly safe in operation, and yet inexpensive to manufacture.

Another object of the present invention is to provide a test head positioning apparatus for positioning the test head of a semiconductor device testing apparatus which is hand-operated, but capable of easily moving a heavyweight test head upwardly and downwardly.

In order to accomplish the foregoing objects, according to a first aspect of the present invention, in a semiconductor device testing apparatus of the type in which semiconductor devices are transported to a test section where the semiconductor devices are subjected to testing and after completion of the testing, are carried out of the test section to a predetermined location, a test head positioning apparatus for use to move test head for applying a test signal having a predetermined pattern to the semiconductor devices vertically upwardly to and downwardly from a predetermined elevation in the test section of the testing apparatus is provided, the test head positioning apparatus comprising: counterbalancer means having a driving force approximately equivalent to the weight of the test head; and hand-operated jack mechanism means for moving the test head vertically upwardly and downwardly.

The counterbalancer means is installed at at least two opposed positions of the test head and the sum of driving forces of these counterbalancer means is set at a level approximately equivalent to the weight of the test head. As the counterbalancer means, an air cylinder, a hydraulic cylinder or an oil spring may be used.

The hand-operated jack mechanism means is disposed on each of the opposite side walls of the test head, the arrangement being such that by an operator manually operating one of the two jack mechanism means, the two jack mechanism means are simultaneously operated to move the test head vertically upwardly and downwardly.

Each of the counterbalancer means includes a lead screw generally horizontally extending and rotatably supported, at least one movable screw member in threaded engagement with the lead screw, and a drive arm pivotally connected at one end to the movable screw member and operative to move the test head vertically upwardly and downwardly as the movable screw member is moved along the lead screw.

The lead screws of the jack mechanism means are coupled together by sprockets secured to the respective lead screws and a chain extending between and connecting the sprockets so as to be simultaneously rotated in the same direction and at approximately the same speed, and a handle is coaxially connected directly to the lead screw of one of the jack mechanism means.

The lead screws of the jack mechanism means may be coupled together by gears secured to the respective lead screws and gearing means disposed between and connecting the gears so as to be simultaneously rotated in the same direction and at approximately the same speed.

In a preferred embodiment, each of the jack mechanism means further includes a driven arm having approximately the same shape and size as the drive arm and movable as the drive arm is moved, the drive arm and the driven arm being pivotally connected together generally at their middle points and pivotally movable as the movable screw member is moved along the lead screw to thereby move the test head vertically upwardly and downwardly.

A plurality of the movable screw member may be threadedly engaged with each of the lead screws of the jack mechanism means, each of the movable screw members being provided with a fixed stud to which the one end of the corresponding one of the drive arms is pivotally connected.

Further, two movable support means may be disposed one on each of the opposite side walls of the test head, the jack mechanism means being mounted on the two movable support means, respectively, and the test head being attached to the two movable support means.

DETAILED DESCRIPTION OF THE PREFERRED EMBODIMENTS

One embodiment of the test head positioner according to the present invention for use with a semiconductor device testing apparatus will be described in details with reference to FIGS. 1 and 2A–2B. While this embodiment represents an instance which is applied to an IC tester having integrated therewith a handler of the horizontal transporting type as described with reference to FIGS. 3 and 4, it will be obvious that the present invention is also applicable to an IC tester having integrated therewith any one of handlers of various constructions other than the horizontal transporting type. Further, the elements shown in FIGS. 1 and 2A–2B corresponding to those of FIG. 5 are designated by like reference numerals and will not be discussed again in detail, unless required.

Figure 1:
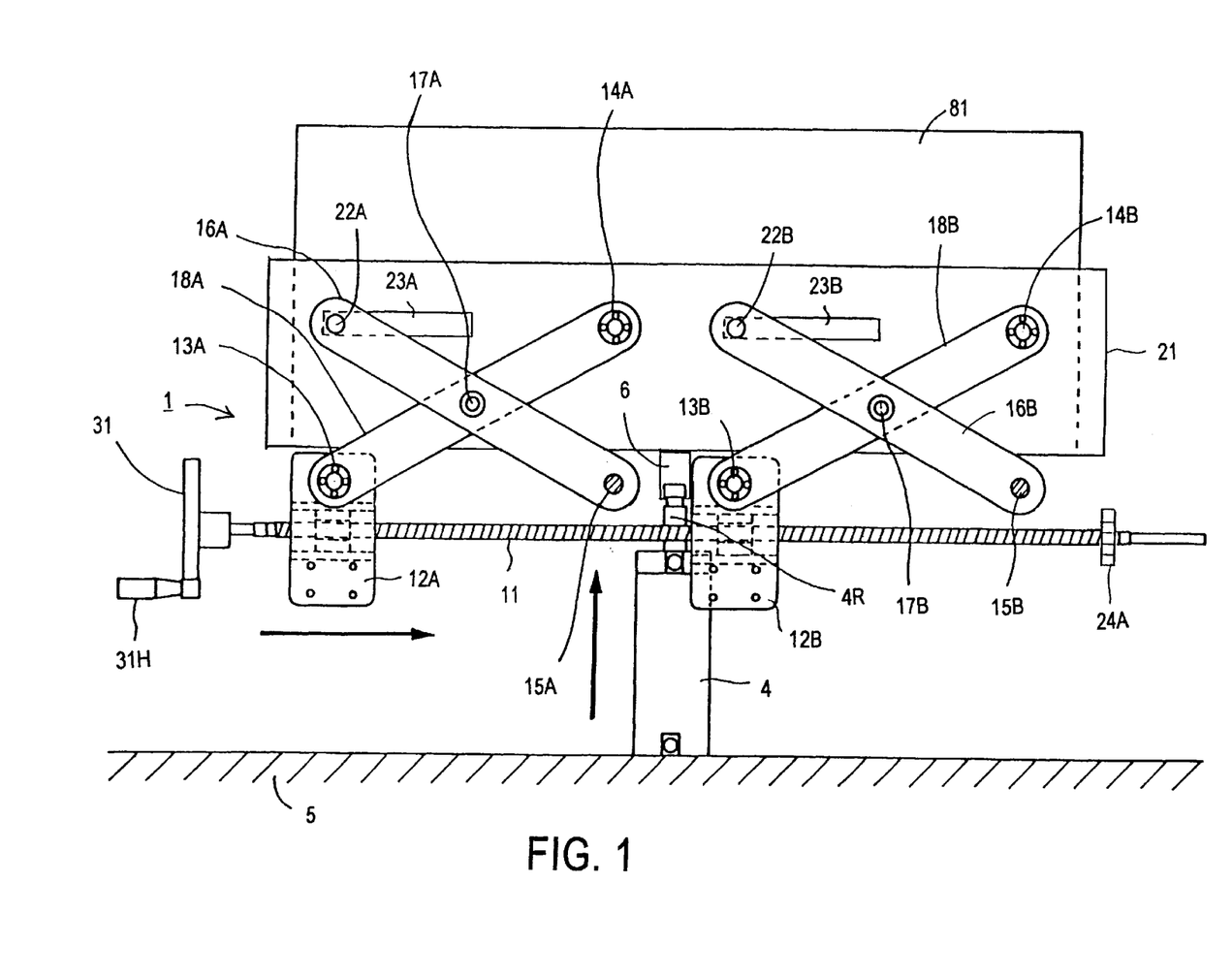
FIG. 1 is a side view illustrating one embodiment of the test head positioner according to the present invention for use with a semiconductor device testing apparatus.

FIG. 1 is a side view illustrating one embodiment of the test head positioner according to the present invention for use with a semiconductor device testing apparatus, and particularly shows the details of the jack mechanism for moving the test head vertically upwardly and downwardly. In this embodiment as well, the test head is shown merely as a block 81. It is also to be noted that while only one side of the test head 81 is shown in FIG. 1, another jack mechanism of a similar construction is provided on the opposite side of the test head as will be readily appreciated from FIG. 2A which is a front view taken from the left-hand side of FIG. 1 and FIG. 2B which is a rear view taken from the right-hand side of FIG. 1.

The illustrated jack mechanism 1 includes two screw pairs comprising a long lead screw (externally threaded screw in this example) 11 horizontally (left-to-right direction in the figure) extending along the lower end edge on one lateral side of the test head 81 at a predetermined elevation below the bottom surface of the test head 81 and two movable screw members 12A and 12B spaced apart from each other by a predetermined distance and having threads (internal threads in this example) therein in threaded engagement with the lead screw 11.

The movable screw members 12A and 12B of these two screw pairs each may comprise a ball screw, for example which is reciprocally moved along the lead screw 11 as the latter is rotated about its own axis. Implanted perpendicularly (in a direction passing through the plane of the drawing of FIG. 1) in the peripheral wall of the movable screw members 12A and 12B adjacent their tops are studs 13A and 13B, respectively, each having one end protruding outwardly.

The jack mechanism 1 further includes two connecting studs 14A and 14B spaced apart from each other by a predetermined distance in the direction of extension of the lead screw 11 and implanted into a generally rectangular movable support block 21 at substantially the same elevation so as to protrude perpendicularly outwardly, the support block 21 being attached to the side wall of the test head 81; two fixed studs 15A and 15B spaced apart from each other by a predetermined distance in the direction of extension of the lead screw 11 and implanted into a support member 2 (see FIGS. 2A–2B) at substantially the same elevation (a position somewhat below the movable support block 21 in this example) so as to protrude perpendicularly outwardly toward the test head, the support member 2 being disposed at a predetermined spacing outwardly from and in opposition to the lead screw 11; two drive arms 16A and 16B pivotally connected at one ends to the studs 13A and 13B, respectively, (which will be referred to as first fixed studs hereinafter) fixed to the movable screw members 12A and 12B, respectively and pivotally connected at the other ends to the connecting studs 14A and 14B, respectively, of the movable support block 21; two driven arms 18A and 18B pivotally connected at one ends to the studs 15A and 15B (which will be referred to as second fixed studs hereinafter), respectively, fixed to the support member; and pivot studs 17A and 17B pivotally connecting the corresponding drive arms and driven arms generally at the middle points intermediate their opposite ends.

Secured to and protruding from the other ends of the driven arms 18A and 18B toward the test head 81 are slide studs 22A and 22B, respectively, which are received in horizontally elongated slots 23A and 23B, respectively, formed in the movable support block 21 at corresponding positions such that the slide studs 22A and 22B will slidingly move in the elongated slots 23A and 23B as the driven arms 18A and 18B are pivotted. The slide studs 22A and 22B of the driven arms 18A and 18B are provided on the side of the test head 81 with detent members for preventing dislodgement to ensure that the slide studs 22A and 22B will slide in the elongated slots 23A and 23B while carrying a part of the weight of the test head 81.

The driven arms 18A, 18B have substantially the same shape and size as the drive arms 16A, 16B and are coupled by the corresponding pivot studs 17A, 17B to the drive arms 16A, 16B in the form of an X figure.

Figure 2A:
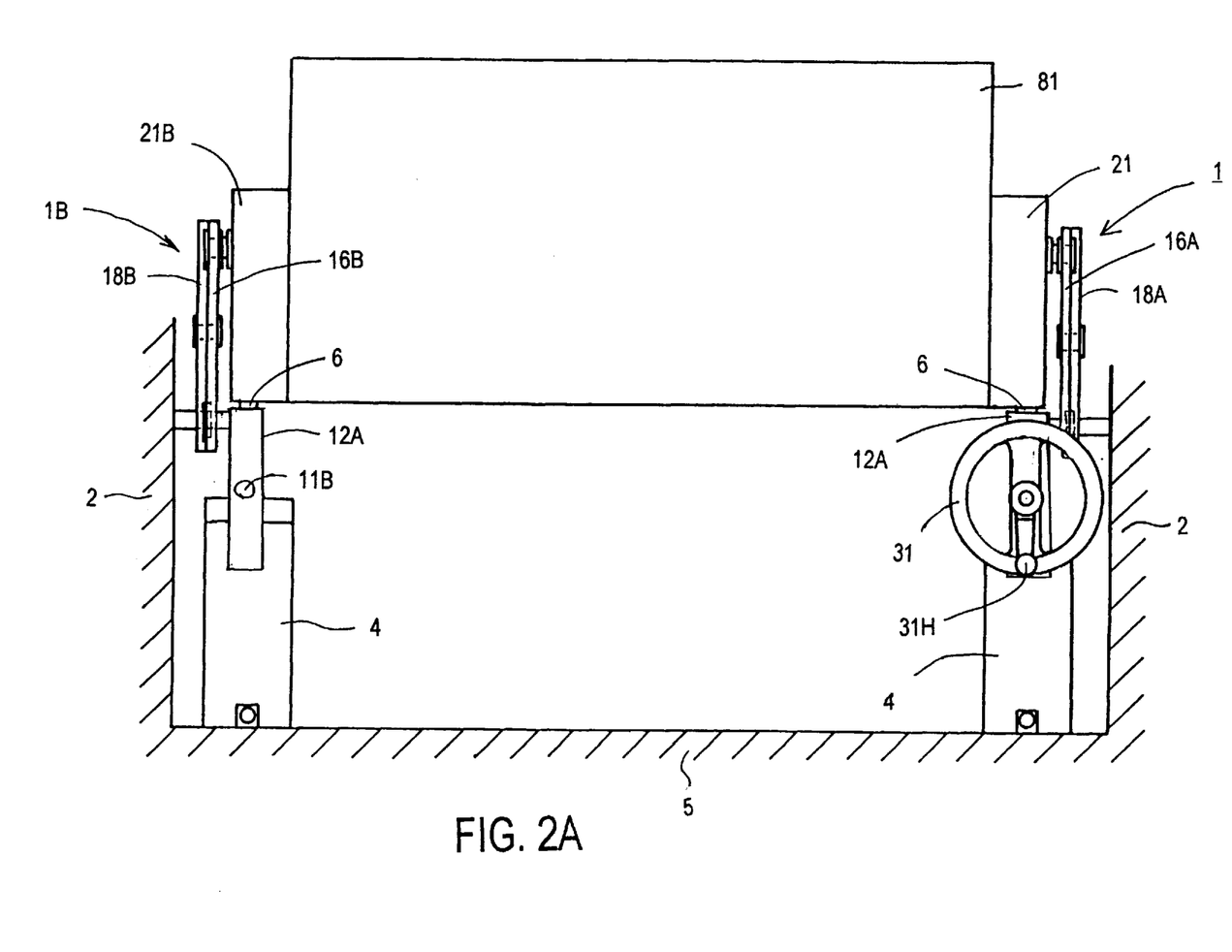
FIG. 2A is a front view taken from the left-hand side of FIG. 1.
Figure 2B:
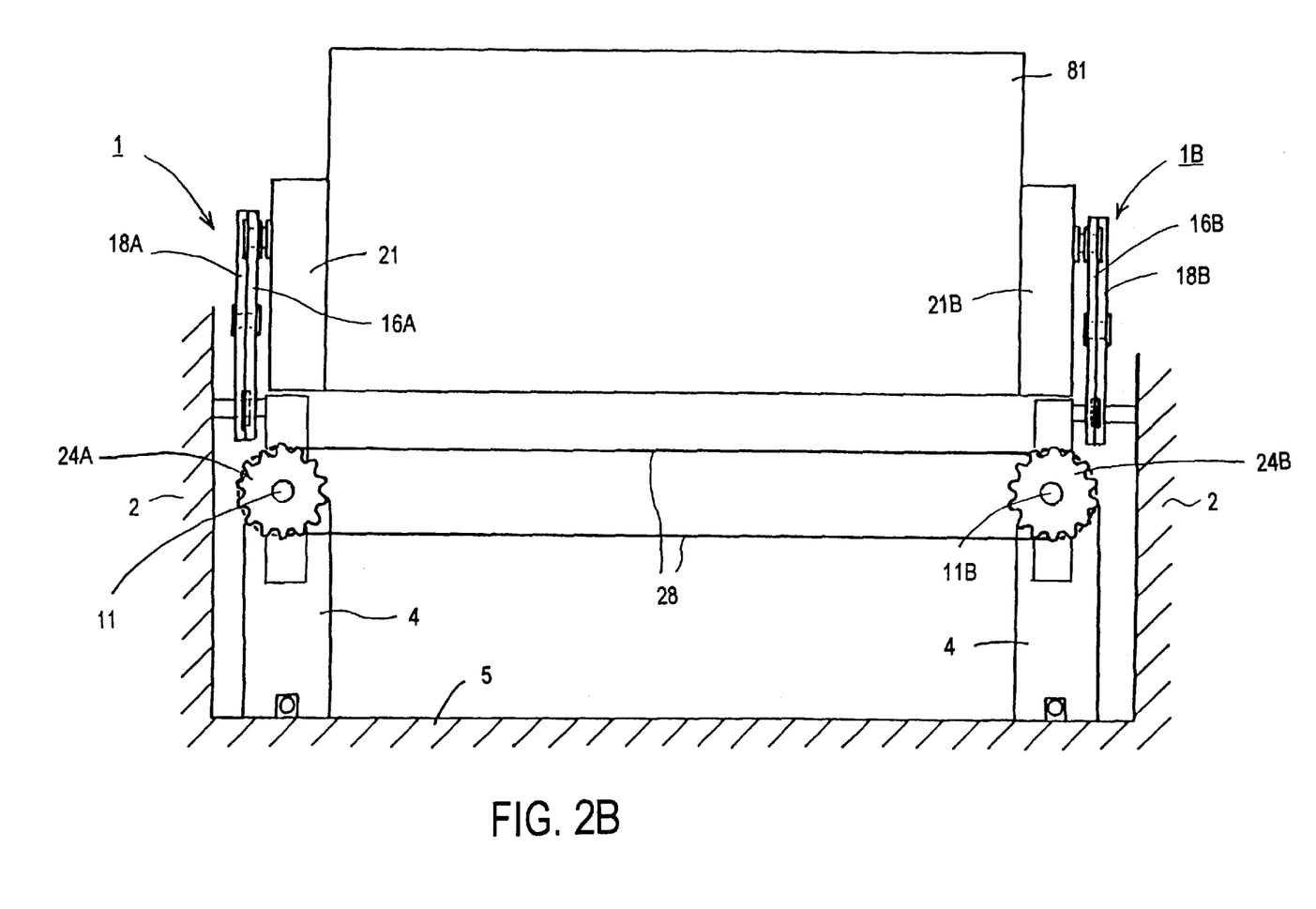
FIG. 2B is a rear view taken from the right-hand side of FIG. 1.

While the support member 2 disposed in opposition to the lead screw 11 is illustrated in FIG. 2 as being directly secured to a supporting base 5 which is an installation surface (floor) on which the handler is installed, practically the frame of the handler is often utilized as the support member 2. In some instances the bottom frame of the handler may be utilized as the supporting base 5.

It is to be noted that the second fixed studs 15A and 15B may be fixed to separate support members, respectively, secured to the supporting base 5. The pivot studs 17A and 17B may be fixed to either of the corresponding drive arms and the driven arms.

The lead screw 11 is rotatably journaled by a plurality of supports, not shown, secured to the supporting base 5, and has a handle 31 coaxially connected at one end and a sprocket 24A secured at the opposite end. The handle 31 is provided with a grip 31H which is used by an operator to manually rotate the handle 31.

The sprocket 24A secured to the lead screw 11 is connected via a chain 28 with a sprocket 24B (FIG. 2B) secured to a lead screw 11B on the opposite side at a corresponding position, so that as the sprocket 24A is rotated by rotation of the lead screw 11, the other sprocket 24B is concurrently rotated by the chain 28, which in turn causes the concurrent rotation of the other lead screw 11B in the same direction. These sprockets 24A and 24B have the same diameter and the number of teeth so as. to rotate both the lead screws 11 and 11B at the same speed and in the same direction.

On the other hand, the movable screw members 12A, 12B are slidably supported on a guide rail, not shown, secured to the supporting base 5 and extending in a direction along the lead screw 11. In this regard, either one or both of the lead screw 11 and the guide rail may be affixed to the frame of the handler. In the illustrated embodiment, both the lead screws 11, 11B and their guide rails are affixed to the frame of the handler rotatably for the former and fixedly for the latter, without the use of any separate support member.

Since a generally rectangular movable support block 21B and a jack mechanism 1B of an identical construction are provided also on the opposite side of the test head 81, the test head 81 is supported at a predetermined elevation above the supporting base 5 (the installation surface of the handler) by a pair of movable support blocks 21, 21B and a pair of jack mechanisms 1, 1B disposed on the opposite sides of the test head, as shown.

According to the present invention, air cylinders 4 are installed at predetermined positions on the supporting base 5 (which is the installation surface of the handler in this example). In this embodiment, two air cylinders 4 are installed below the test head 81, one at each of the opposite left and right side walls with piston rods 4R of these air cylinders 4 being connected via coupling members 6 to the bottoms of the movable support blocks 21, 21B, respectively. The upward thrust of each of these air cylinders 4 is set at a magnitude equivalent to one half of the weight of the test head 81. In other words, the two air cylinders 4 act merely as a counter-balancer since they together have no more than the upward thrust just sufficient to cancel out or counterbalance the weight of the test head 81. This permits the use of small-sized inexpensive air cylinders since the two air cylinders need not have such a vast thrust to raise the test head 81. While the air cylinders 4 are employed in this embodiment, it will be obvious to one skilled in the art that hydraulic cylinders, oil springs or any other equivalent devices may be used for the purpose of the present invention.

The operation of the jack mechanisms 1, 1B constructed as discussed above will now be described below.

First, the test head 81 is transported to a predetermined position below the test section of the handler, and the movable support blocks 21, 21B are attached to the test head 81 on its opposite side walls. At this point, the jack mechanisms 1, 1B are in the initial position illustrated in FIG. 1. It is to be noted here that the weight of the test head 81 is not exerted on the jack mechanisms 1, 1B at all as it is borne by the two air cylinders 4.

Then, the operator turns the handle 31 to rotate the lead screw 11 in a clockwise direction in this example. Since no weight of the test head 81 is exerted on the jack mechanisms 1, 1B as noted above, the handle 31 is easy to rotate, requiring no reduction gearing in contrast to the prior art as shown in FIG. 6. The movable screw members 12A, 12B in the position shown in FIG. 1 are thus moved in a direction indicated by the arrow 19 in the drawing, so that the one ends of the drive arms 16A, 16B pivotally supported by the first fixed studs 13A, 13B of the movable screw members 12A, 12B are moved gradually toward the second fixed studs 15A, 15B, respectively. As a result, since the driven arms 18A, 18B are pivotally supported at one ends by the second fixed studs 15A, 15B, respectively, the drive arms 16A, 16B are pivoted (counterclockwise) about the pivot studs 17A, 17B toward a vertical position to thereby lift the connecting studs 14A and 14B secured to the movable support block 21 upwardly.

Concurrently, the pivotal movement of the drive arms 16A, 16B toward the vertical position moves the pivot studs 17A, 17B obliquely to the right and upwardly, and thereby causes the driven arms 18A, 18B to be pivoted (clockwise) about the second fixed studs 15A, 15B toward a vertical position. As a result, a drive force is produced to move the connecting studs 14A and 14B of the movable support block 21 vertically upwardly. Consequently, the movable support block 21 is moved upwardly in a vertical direction, and hence the test head 81 attached to the movable support block 21 is concurrently moved vertically upwardly.

It is thus to be appreciated that by turning the handle 31 to rotate the lead screw 11 of the one jack mechanism 1, which in turn causes simultaneous rotation of the lead screw 11B of the other jack mechanism 1B by means of the sprocket 24A, chain 28 and sprocket 24B, the test head 81 is gradually raised vertically to a predetermined elevation as it is precisely positioned with respect to the test section of the handler. Upon the test head reaching that elevation, the rotation of the handle 31 is ceased to hold the test head 81 at that elevation. In this state, the test head 81 is mounted in place to the test section of the handler by means of a fixture such as a Hi-fix base such that the IC sockets mounted on the test head 81 are exposed in the interior of the test section.

When the test head 81 is to be lowered, the fixture is disconnected from the test section of the handler prior to turning the handle 31 in the opposite direction to rotate the lead screws 11, 11B in a counterclockwise direction in this example. It will be readily appreciated that this will move the movable screw members 12A, 12B in a direction opposite from that indicated by the arrow 19 to thereby lower the test head 81 to the initial position shown in FIG. 1, and further description is omitted.

In the initial position shown in FIG. 1, the arrangement is such that the central axes of the first fixed studs 13A, 13B of the movable screw members 12A, 12B and of the second fixed studs 15A, 15B of the support member disposed in opposition to the lead screw 11 lie at substantially the same elevation (in the same horizontal plane), that the central axes of the connecting stud 14A of the movable support block 21 and of the second fixed stud 15A of the support member disposed in opposition to the lead screw 11 lie in substantially the same vertical plane, and that the central axes of the connecting stud 14B of the movable support block 21 and of the second fixed stud 15B of the support member disposed in opposition to the lead screw 11 lie in substantially the same vertical plane. However, the arrangement is not limited to that illustrated.

It should be noted that if the number of movable screw members threadedly engaged with the lead screws 11, 11B is increased over the illustrated two screws with a commensurate increase in the number of sets of drive arms and driven arms for supporting and moving the movable support blocks 21, 21B vertically, not only the vertical movement of the test head 81 may be smoothed, but also the weight of the test head 81 may be more positively burdened by an increased number of sets of drive arms and driven arms.

With the construction described above in which no weight of the test head 81 is exerted on the jack mechanisms 1, 1B, the operator may rotate the handle 31 easily (with a less power) despite the fact that the handle 31 is connected directly to the lead screw 11. Requiring no reduction gearing in this way permits the lead screws 11, 11B to be rotated at a considerably faster speed to thereby facilitate the quick movement of the test head 81 in vertically upward and downward directions. It will thus be appreciated that there is no problem with the speed of the upward and downward movement of the test head 81. In addition, any increase in the weight of the test head 81 would not in the least affect the maneuvering of the handle 31 by the operator as any increase in the weight is canceled by the air cylinders 4 serving as couterbalancers. Accordingly, it is apparent that the present invention provides a hand-operated test head positioning apparatus having very excellent operability.

Moreover, since the power source for moving the test head up and down is derived from nothing but a manual axial torque input into the lead screw by the handle operation by the operator, the operator can accurately feel the mutual positional relation between the test section of the handler to which the test head is to be connected and the jack mechanism, so that the need for communication means may be eliminated. Needless to say, no motor control circuit is required.

On top of that, utilizing multiple air cylinders merely as a counter-balancer permits the use of small-sized inexpensive air cylinders, adding little to the initial cost of the entire IC tester. Besides, the load exerted on the various components of the jack mechanism does not exceed the range of the manual axial torque, ensuring the safe and smooth operation.

What is more, with regard to the measures for preventing the test head from falling in the event of accidental failure of power source, no special preventive measures are necessary, since the driving through movable screw members engaged with a lead screw instead of motor driving makes it possible to take up the falling load under the static load condition by the friction between the lead screw and the movable screw members if a plurality of the movable screw members are used as in the embodiment described above.

It should also be noted that in the case that the air supply to the air cylinders may be accidentally stopped, safety would be secured as the air cylinders are maintained at the set pressure by interposing check valves between the cylinders and an air source.

While in the embodiment described above the arrangement is such that the jack mechanisms 1, 1B move the movable support blocks 21, 21B vertically up and down by means of which the test head 81 attached to the movable support blocks 21, 21B is moved up and down, the jack mechanisms 1, 1B may be configured to directly move the test head 81 up and down. In this instance, the connecting studs 14A, 14B are secured to the test head 81 and the horizontal elongated slots 23A, 23B in which the slide studs 22A, 22B of the driven arms 18A, 18B are slidingly moved are formed in the test head 81.

Alternatively, instead of the elongated slots 23A, 23B, two horizontally extending parallel spaced apart guide rails may be formed or mounted on either side walls of the test head 81 or the movable support blocks 21, 21B. In this case, the vertical spacing between the two parallel guide rails is made somewhat larger than the outer diameter of the slide studs 22A, 22B so that the slide studs 22A, 22B of the driven arms 18A, 18B may slide horizontally along the guide rails with the weight of the test head 81 supported by the upper guide rail. It will thus be understood that provision of such guide rails may provide similar functional effects as provided by the formation of the elongated slots 23A, 23B. Further, even with the provision of only the upper rail, it is capable of supporting the weight of the test head 81 and hence may provide similar functional effects as provided by the formation of the elongated slots 23A, 23B. Accordingly, it should be understood that the present invention is not limited to the arrangement and construction of the embodiment as described above with reference to the drawings.

What is claimed is:

1. A test head positioning apparatus in a semiconductor device testing apparatus of the type in which semiconductor devices are transported to a test section where the semiconductor devices are subjected to testing and after completion of the testing, are carried out of the test section to a predetermined location, wherein said test head positioning apparatus is used to move a test head for applying a test signal having a predetermined pattern to the semiconductor devices vertically upwardly to and downwardly from a predetermined elevation in said test section of the semiconductor device testing apparatus, said test head positioning apparatus comprising:

a plurality of counterbalancers having a driving force approximately equivalent to the weight of said test head, wherein said counterbalancers are installed at at least two opposed positions of said test head and the sum of driving forces of these counterbalancers are set at a level approximately equivalent to the weight of said test head; and a hand-operated jack for moving said test head vertically upwardly and downwardly.

2. The test head positioning apparatus set forth in claim 1, wherein said plurality of counterbalancers comprise a plurality of air cylinders, hydraulic cylinders or oil springs.

3. The test head positioning apparatus set forth in claim 1 or 2, wherein two movable supports are disposed on opposite side walls of said test head, said jack being mounted on each of said two movable supports.

4. A test head positioning apparatus set forth in claim 1, wherein said hand-operated jack comprises two mechanisms disposed on opposite side walls of said test head such that by an operator manually operating one of said two mechanisims, both mechanisms are simultaneously operated to move said test head vertically upwardly and downwardly.

5. The test head positioning apparatus set forth in claim 4, wherein each of said counterbalancers comprises an air cylinder, a hydraulic cylinder or an oil spring.

6. The test head positioning apparatus set forth in claim 4, wherein each of said mechanisms comprises a lead screw generally horizontally extending and rotatably supported; at least one movable screw member in threaded engagement with said lead screw; and a drive arm pivotally connected at one end to said movable screw member and operative to move said test head vertically upwardly and downwardly as said movable screw member is moved along said lead screw.

7. The test head positioning apparatus set forth in claim 6, wherein said lead screws of said mechanisms are coupled together by sprockets secured to the respective lead screws and a chain extending between and connecting said sprockets so as to be simultaneously rotated in the same direction and at approximately the same speed, and including a handle coaxially connected directly to the lead screw of one of said mechanisms.

8. The test head positioning apparatus according to claim 6, wherein said lead screws of said mechanisms are coupled together by gears secured to the respective lead screws so as to be simultaneously rotated in the same direction and at approximately the same speed, and including a handle coaxially connected directly to the lead screw of one of said mechanisms.

9. The test head positioning apparatus set forth in claim 6, wherein each of said mechanisms includes a driven arm having approximately the same shape and size as said drive arm and movable as said drive arm is moved, said drive arm and said driven arm being pivotally connected together generally at their middle points and pivotally movable as said movable screw member is moved along said lead screw to thereby move said test head vertically upwardly and downwardly.

10. The test head positioning apparatus set forth in any one of claims 6 to 9, wherein a plurality of said movable screw members are threadedly engaged with each of said lead screws of said mechanisms, each of said movable screw members being provided with a fixed stud to which said one end of said corresponding drive arms are pivotally connected.

11. The test head positioning apparatus set forth in claim 10, wherein two movable supports are disposed on opposite side walls of said test head, said mechanisms being mounted on said two movable supports, respectively.

12. The test head positioning apparatus set forth in any one of claims 4, through 9, wherein two movable supports are disposed on opposite side walls of said test head, said mechanisms being mounted on said two movable supports, respectively.

\* \* \* \* \*